US007927966B2

(12) United States Patent
Nguyen Hoang et al.

(10) Patent No.: US 7,927,966 B2
(45) Date of Patent: Apr. 19, 2011

(54) METHOD OF MANUFACTURING OPENINGS IN A SUBSTRATE, A VIA IN SUBSTRATE, AND A SEMICONDUCTOR DEVICE COMPRISING SUCH A VIA

(75) Inventors: Viet Nguyen Hoang, Leuven (BE); Martinus T. Bennebroek, Den Bosch (NL)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 12/518,684

(22) PCT Filed: Dec. 10, 2007

(86) PCT No.: PCT/IB2007/054992
§ 371 (c)(1),
(2), (4) Date: Jun. 11, 2009

(87) PCT Pub. No.: WO2008/072165
PCT Pub. Date: Jun. 19, 2008

(65) Prior Publication Data
US 2010/0059894 A1    Mar. 11, 2010

(30) Foreign Application Priority Data
Dec. 12, 2006  (EP) .................................. 06125914

(51) Int. Cl.
*H01L 21/3065* (2006.01)
(52) U.S. Cl. .. 438/427; 438/700; 438/733; 257/E21.233
(58) Field of Classification Search .................. 438/427, 438/700, 733, FOR. 227, FOR. 388; 257/E21.233
See application file for complete search history.

(56) References Cited

U.S. PATENT DOCUMENTS

| | | | | |
|---|---|---|---|---|
| 5,352,324 | A | * 10/1994 | Gotoh et al. | .................. 438/714 |
| 6,074,908 | A | 6/2000 | Huang | |
| 6,100,183 | A | 8/2000 | Lu et al. | |

(Continued)

FOREIGN PATENT DOCUMENTS

EP    1 848 031 A    10/2007
(Continued)

OTHER PUBLICATIONS

Wolf, S., et al; "Silicon Processing for the VLSI ERA, Process Technology", vol. 1, p. 185, 1980.

*Primary Examiner* — George Fourson

(57) ABSTRACT

The invention relates to a method of manufacturing openings in a substrate (5), the method comprising steps of: providing the substrate (5) with a masking layer (40) on a surface thereof; forming a first opening (10), a second opening (30), and a channel (20) in between the first opening (10) and the second opening (30) in the masking layer (40), the channel (20) connecting the first opening (10) with the second opening (30), the second opening (30) having an area (A2) that is larger than the area (A1) of the first opening (10); forming trenches (11, 21, 31) in the substrate (5) located at the first opening (10), the second opening (30), and at the channel (20) under masking of the masking layer (40) by means of anisotropic dry etching, and sealing off the trench (21) located at the channel (20) for forming the openings in the substrate (5). The method of the invention enables formation of a deeper first opening (10) than what is possible with the known methods. The invention further relates to a method of manufacturing a via in a substrate (5), which may be advantageously used in 3-dimensional integrated circuits.

15 Claims, 9 Drawing Sheets

U.S. PATENT DOCUMENTS

| | | | |
|---|---|---|---|
| 6,372,634 B1 * | 4/2002 | Qiao et al. | 438/637 |
| 6,563,079 B1 * | 5/2003 | Umetsu et al. | 219/121.71 |
| 7,125,804 B2 * | 10/2006 | Donohoe et al. | 438/695 |
| 2002/0105087 A1 | 8/2002 | Forbes et al. | |
| 2005/0029630 A1 | 2/2005 | Matsuo | |
| 2005/0062165 A1 | 3/2005 | Saenger et al. | |
| 2006/0197181 A1 * | 9/2006 | Noguchi | 257/530 |
| 2007/0134928 A1 * | 6/2007 | Lee et al. | 438/745 |
| 2007/0249163 A1 * | 10/2007 | Oikawa | 438/637 |
| 2010/0109114 A1 * | 5/2010 | Izumi | 257/434 |

FOREIGN PATENT DOCUMENTS

| | | |
|---|---|---|
| WO | 00/63960 A1 | 10/2000 |
| WO | 01/24256 A | 4/2001 |

* cited by examiner

METHOD OF MANUFACTURING OPENINGS IN A SUBSTRATE, A VIA IN SUBSTRATE, AND A SEMICONDUCTOR DEVICE COMPRISING SUCH A VIA

FIELD OF THE INVENTION

The invention relates to a method of manufacturing openings in a substrate, the method comprising steps of:
providing a substrate having a masking layer provided on a surface thereof;
forming an opening in the masking layer; and
forming a trench in the substrate located at the opening under masking of the masking layer by means of anisotropic dry etching.

The invention further relates to a method of manufacturing a via in a substrate. The invention also relates to a semiconductor device comprising such a via, and to a 3-dimensional integrated circuit comprising a stack of such semiconductor devices.

BACKGROUND OF THE INVENTION

Such methods are known. With the end of CMOS scaling on the horizon, integrated circuit (IC) manufacturers are looking for alternative ways to boost device density (per foot-print area) and performance. One attractive manner is to build a 3-dimensional IC, in which multiple conventional ICs are stacked on top of each other. In order to realize such a 3D-IC, one crucial issue is to make vertical interconnections between the IC's. It is generally agreed that the size and density of vertical interconnections between devices layers of a 3D IC are of importance to the performance of the IC. Small diameter and high-density vertical interconnections are preferred as they provide more routing freedom in 3D-IC while consuming less active silicon area. Vertical interconnections are usually in the form of through silicon substrate vias.

Nowadays, through substrate (e.g. silicon (Si) substrate) vias are commonly formed by means of dry etching. A fundamental limitation of this technique is the proportional relation between via size (diameter) and via depth. The smaller the via diameter (which is required because of technology scaling), the smaller the via depth. Thus, when used in the manufacturing of 3D-IC's, the via depth dictates the substrate thickness and, therefore, the mechanical and handling properties of an IC layer during the stacking process. A thick substrate is strongly preferred as it provides better mechanical integrity and is easier to handle. A substrate is considered "thick" if it is a significant factor thicker than the via diameter. For instance, if the via diameter is 200 nm, a substrate with a thickness of more than 10 µm is generally considered as thick. However, from a wafer handling point-of-view thick usually means a substrate thicker than 100 µm, which enables conventional handling.

A drawback of the known methods is that they do not enable the manufacturing of high-aspect ratio openings in a substrate when the openings are small. Also the known methods do not enable the manufacturing of high-aspect ratio through-substrate vias. For example, the manufacturing of an opening in a substrate having a diameter of only a few hundred nanometers and a depth of more than 50 µm is impossible with the known methods.

SUMMARY OF THE INVENTION

It is an object of the invention to provide a method, which enables the manufacturing of an opening in a substrate having a higher aspect ratio than what is possible with the known methods.

It is a further object of the invention to enable the manufacturing of through-substrate vias having a much higher aspect ratio than what is possible with the known methods.

The invention is defined by the independent claims. The dependent claims define advantageous embodiments.

According to a first aspect of the invention the objects are realized in that the method comprises steps of:
providing the substrate with a masking layer on a surface thereof;
forming a first opening, a second opening, and a channel in between the first opening and the second opening in the masking layer, the channel connecting the first opening with the second opening, the second opening having an area that is larger than the area of the first opening;
forming trenches in the substrate located at the first opening, the second opening, and at the channel under masking of the masking layer by means of anisotropic dry etching, and
sealing off the trench located at the channel for forming the openings in the substrate.

The effect of the features of the method of the invention is that the trench located at the first opening can be etched much deeper than what is possible with the known methods. Due to its larger size, the trench located at the second opening can be etched deeper into the substrate. Because of the fact that the second opening is linked to the first opening via the channel, the trench being formed (in the step of forming trenches) located at the second opening will act as some sort of a etching-species reservoir which helps to provide etching species to the trenches located at the first opening and the channel. The result is that this makes it possible to etch the trench located at the first opening (and channel) to a comparable depth as the trench located at the second opening (reservoir). This depth would not be possible if the first opening and the second opening were not linked, because in that case there will be a lack of etching species in the trench located at the first opening once the depth exceeds a critical value (depending on the aspect ratio of the trench, the aspect ratio being defined as the depth divided by the smallest width of the trench). The sealing of the trench located at the channel finalizes the formation of the first opening, whereafter other process steps known to the person skilled in the art may be carried out. The method according to the invention enables the realization of small (width<~1 µm), high density and deep (depth>~50 µm) through-(silicon)-substrate openings using dry etching.

In embodiments of the invention the trench located at the second opening is sealed off after formation of the trenches, which leaves the trench located at the first opening as the only trench available for further process steps.

In an advantageous embodiment of the method according to the invention the channel is formed with a minimum channel width chosen smaller than a minimum width of the first opening, the minimum channel width being defined as the minimum dimension measured parallel to the surface and perpendicular to the channel, the minimum width of the first opening being defined as the minimum dimension of the first opening measured in any direction parallel to the surface. The advantage of this feature is that the channel can be easily sealed off by means of a conformal deposition of a layer of material on all sidewalls of the trenches. When the deposited layer has a thickness of half the minimum channel width it properly seals off the trench located at the channel, while at the same time the trench located at the first opening is not sealed off, because it is wider.

Preferably, the sealing off of the trench located at the channel is done by depositing a sealing layer in a conformal way on the substrate and on all sidewalls of the trenches. In one embodiment of the method according to the invention, the sealing layer is a dielectric. Using a dielectric layer for the sealing layer has the advantage that the first opening is electrically isolated from the rest of the substrate, which may be required in case a via is manufactured in the substrate.

In preferred embodiments of the method according to the invention an aspect ratio of the trench formed at the first opening is larger than 50. Such an aspect ratio is not possible with conventional dry etching techniques. Preferably, the width of the first opening is smaller than 2 µm. It is even more preferred that the width of the first opening is smaller than 1 µm, yet it is even more preferred that the width of the first opening is smaller than 0.5 µm. Such a width enables a high-density of openings in the substrate, which is very beneficial in state of the art process technologies having a high packing density. Furthermore, when such a width is used for the first opening, the openings may reach depths of larger than to 50 times the width of the first opening.

In a very advantageous embodiment of the method according to the invention, in the step of forming openings in the masking layer, a further opening and a further channel in between the further opening and the second opening are formed in the masking layer, the further channel connecting the further opening with the second opening, the second opening having a larger area than the further opening, wherein preferably, in the step of forming trenches in the substrate, further trenches are formed at the further opening and at the further channel. The advantage of this embodiment is that two openings benefit from the same second opening, which then acts as an etching species reservoir to both the first opening and the further opening. In a further embodiment of the invention multiple further openings are provided in the masking layer, which makes multiple openings benefit from the same second opening.

In embodiments of the method according to the invention, in the step of providing the substrate, the masking layer may be a hardmask, which is then patterned using conventional lithography techniques. Alternatively, the masking layer may be a photoresist layer.

In embodiments of the method according to the invention, the substrate is a semiconductor substrate. Preferably, the substrate comprises silicon.

The invention further relates to a method of manufacturing a via in a substrate comprising the steps of the method of manufacturing the opening, wherein, after the step of sealing off the trench located at the channel, the trench located at the first opening is filled with a conductive material for forming the via. By doing so, vias are formed which are suitable for use as through-substrate vias, because of their high aspect ratio, which can be very high. This is especially advantageous in the case of thick substrates, which may be preferred because of handling issues.

In a further improvement the conductive material used for filling the trench located at the first opening comprises a metal. Metals generally have a low resistivity, which is beneficial for the operation of the semiconductor device.

Preferably, the metal comprises Tungsten. Tungsten is a metal that has superb filling properties when filling high-aspect ratio openings.

In preferred embodiments of the method of manufacturing a via in a substrate the trench located at the second opening is sealed off after formation of the trenches. Preferably, the step of sealing off the trench located at the second opening comprises filling the trench located at the second opening.

In one variant of the last mentioned embodiment of the method the filling of the trench located at the second opening is done by means of deposition of dielectric material in a non-conformal way on the substrate such that the dielectric material fills the trench located at the second opening and covers the substrate. When the area of the first opening is smaller than the area of the second opening, this step may close off the trench located at the first opening at the surface of the substrate. In that case, the method may further comprise a step of removing redundant dielectric material on the substrate (which extends above the surface of the substrate) by means of chemical-mechanical polishing. This step will then re-open the first opening. Preferably, the redundant dielectric material is not removed completely by means of CMP, because debris could fall into the first opening. It is preferred that the CMP is stopped before the first opening is re-opened, whereafter a dry etching step may be used to finalize the removal of the redundant material.

In another variant the filling of the trench located at the second opening is done with a conductive material. This feature turns the second opening into a super via which may serve various different applications. First of all, the super via may be used as a heat-conducting channel. Second, the super via may be used for carrying large currents, for example as a through-substrate power line. A third application is to use the super via as a low-resistance via for RF applications. A further application is to use the super via as a shield for signals going through other vias in the substrate. In case the conductive material is provided such that it fills the trench at the second opening and covers the substrate, the method according to the invention preferably comprises a chemical-mechanical polishing step to remove the redundant conductive material.

A very advantageous variation of the last mentioned embodiment is obtained if the filling of the trench located at the second opening is done simultaneously with the filling of the trench located at the first opening. This saves one processing step.

The invention also relates to a semiconductor device comprising a via in its substrate, the semiconductor device further comprising a circuit integrated therein, the via being a through-substrate via. The semiconductor device obtained by the method according to the invention is very suitable for use in 3-dimensional integrated circuits having thick substrates, because the invention enables the manufacturing of high-aspect ratio through-substrate vias, which can be used as vertical interconnections.

The semiconductor device obtained by the invention is also very suitable for use in a semiconductor device, which needs to be contacted from its backside (e.g. this might be required because of the package chosen for the integrated circuit.

The invention also relates to a 3-dimensional integrated circuit comprising a stack of such semiconductor devices, wherein the circuits on the semiconductor devices are interconnected by at least one through-substrate via. Such a 3-dimensional integrated circuit benefits greatly from the method according to the invention, because the invention has enabled high-density high aspect-ratio vertical interconnections between the stacked semiconductor devices.

BRIEF DESCRIPTION OF THE DRAWINGS

Any of the additional features can be combined together and combined with any of the aspects. Other advantages will be apparent to those skilled in the art. Numerous variations and modifications can be made without departing from the scope of the claims of the present invention. Therefore, it should be clearly understood that the present description is illustrative only and is not intended to limit the scope of the present invention.

How the present invention may be put into effect will now be described by way of example with reference to the appended drawings, in which.

DETAILED DESCRIPTION OF THE PREFERRED EMBODIMENTS

Figure 1:
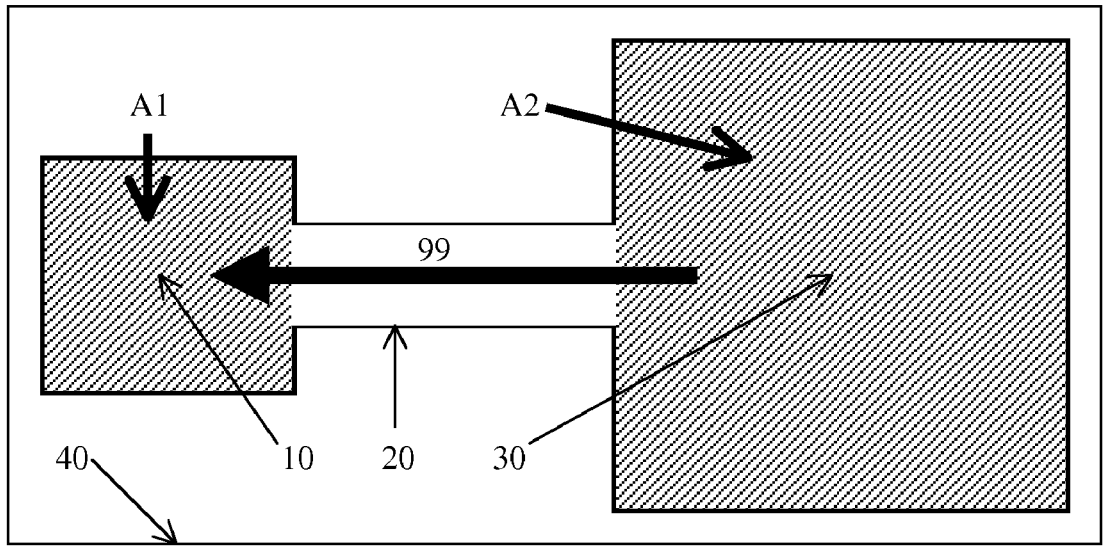
FIG. 1 illustrates the operation of the method of manufacturing openings according to the invention.

Referring to FIG. 1, this Figure illustrates the operation of the method of manufacturing openings according to the invention. The Figure shows a patterned masking layer 40 comprising a first opening 10, a second opening 30, and a channel 20 between the first opening 10 and the second opening 30. In the method according to the invention this masking layer 40 is used on a substrate (not shown) in an anisotropic dry etching step. The second opening 30 has an area A2 that is larger than the area A1 of the first opening 10. The effect of this feature is that, during the anisotropic dry etching of the substrate, due to its larger size, the trench located at the second opening 30 can be etched deeper into the substrate than what is possible with the first opening 10 in case the first opening would be on its own (isolated). Because of the fact that the second opening 30 is linked to the first opening 10 via the channel 20, the trench being formed in the substrate located at the second opening 30 will act as some sort of a etching-species reservoir which helps to provide etching species 99 to the trenches located at the first opening 10 and the channel 20. The result is that this makes it possible to etch the trench located at the first opening 10 (and channel 20) to a comparable depth as the trench located at the second opening 30 (reservoir). This depth would not be possible if the first opening 10 and the second opening 30 were not linked, because in that case there will be a lack of etching species 99 in the trench located at the first opening 10 once the depth exceeds a critical value. This critical value depends on the aspect ratio of the trench, the aspect ratio being defined as the depth divided by the smallest width of the trench. In conventional methods maximum aspect ratio lies in the order of 20 to 30. This also depends on the shape of the opening. A round opening usually results in deeper trenches than a square-shaped opening.

Figure 2:
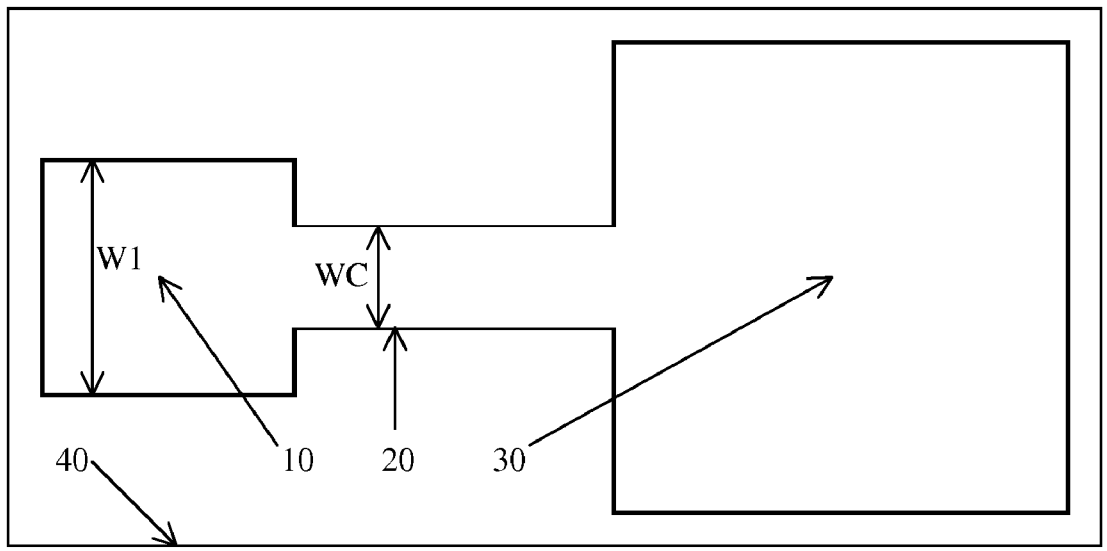
FIG. 2 illustrates an advantageous shape of the channel used in the masking layer in the method according to the invention.

Referring to FIG. 2, this Figure illustrates an advantageous shape of the channel used in the masking layer in the method according to the invention. The channel 20 has a minimum width WC and the first opening 10 has a minimum width W1. One of the steps of the method of manufacturing openings according to the invention is to seal-off the trench in the substrate located at the channel 20. This is advantageously done in case the minimum channel width WC is smaller than the minimum width W1 of the first opening 10. The minimum channel width WC is defined as the minimum dimension measured parallel to the surface and perpendicular to the channel 20. The minimum width W1 of the first opening 10 is defined as the minimum dimension of the first opening 10 measured in any direction parallel to the surface.

In the example of FIG. 2 the channel 20 is relatively long, has no bends, and has a uniform width. All these features are not essential for the invention. The channel 20 may be shorter or longer, it may have a bend (or multiple bends), and the width may vary along its length. What is essential is that it connects the first opening 10 with the second opening 30 for enabling etching species 99 (FIG. 1) to flow from the second opening 30 to the first opening 10. It could theoretically be argued that the channel 20 belongs to the second opening 30, which is a matter of definition of the second opening 30. However, in this invention it is important that there a region is identifiable between the first opening 10 and the second opening 30 which can be sealed off for finalizing the formation of the first opening 10. This region is defined as the channel 20. In some embodiments of the method the minimum value of the channel width WC is an important parameter, as will be explained later.

Figure 3:
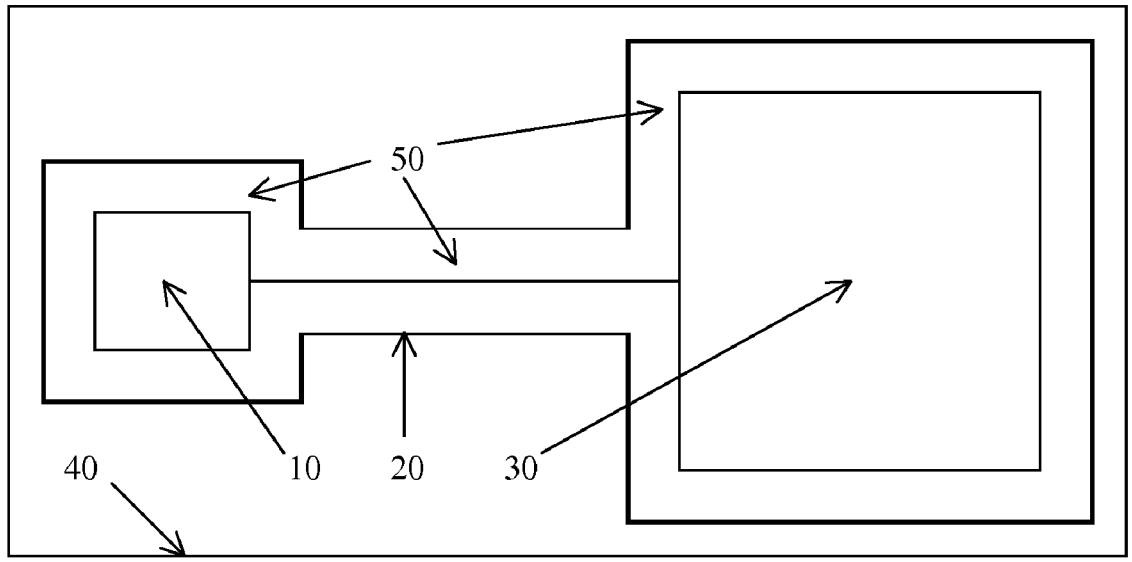
FIG. 3 illustrates an embodiment of the method wherein the trench located at the channel is sealed off in a special way.

Referring to FIG. 3, this Figure illustrates an embodiment of the method wherein the trench located at the channel 20 is sealed off in a special way. After etching of the trenches in the substrate to the required depth, isolation of trench located at the first opening 10 and the trench located at the second opening 30 is done by conformal deposition of sealing layer 50 on all sidewalls of the trenches located at the openings and the channel. This sealing layer 50 may be a dielectric, in which case it also provides electrical insulation of the openings 10, 30. The trench located at the channel 20 will be sealed of once the thickness of the deposited sealing layer 50 is larger than half of the channel width WC (FIG. 2). This embodiment is only advantageous if the minimum width W1 of the first opening 10 is larger than the minimum width WC of the channel 20, because otherwise the first opening 10 would be sealed off as well.

Figure 4:
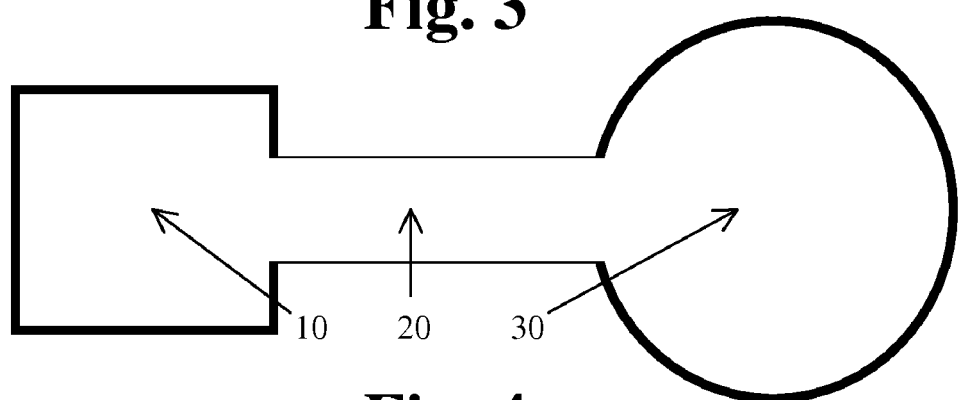
FIG. 4 shows a combination of different shapes of the first and second opening manufactured in the method according to the invention.
Figure 5:
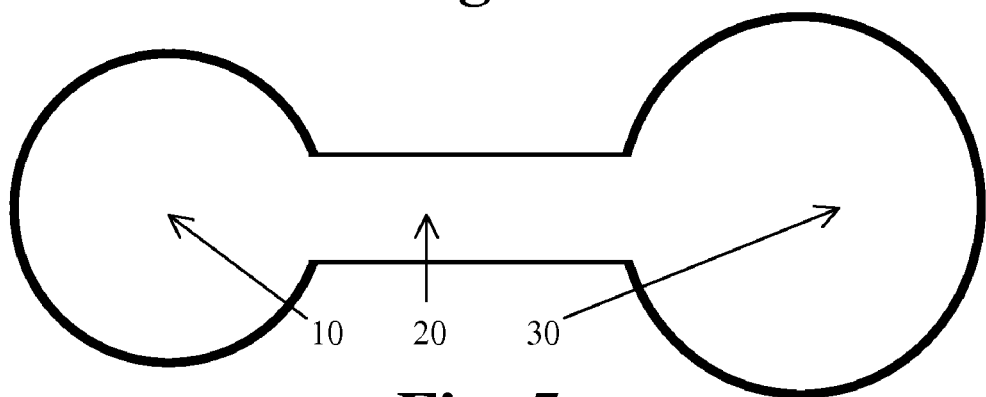
FIG. 5 shows an alternative combination of shapes of the first and second opening manufactured in the method according to the invention.

Referring to FIG. 4 and FIG. 5, these Figures illustrate variations in the shape of the first opening 10 and second opening 30. The openings 10, 30 may be square-shaped, rectangular, circular (FIG. 5), or any other form. Also, different shapes may be combined for the first opening and the second opening, e.g. square-shaped for the first opening 10 (FIG. 4). The shape of the openings 10, 30 is not important, but it is essential that the second opening 30 has a larger area than the first opening 10, so that the second opening 30 acts as a etching-species 99 (FIG. 1) reservoir during the anisotropic etching step.

Figure 6:
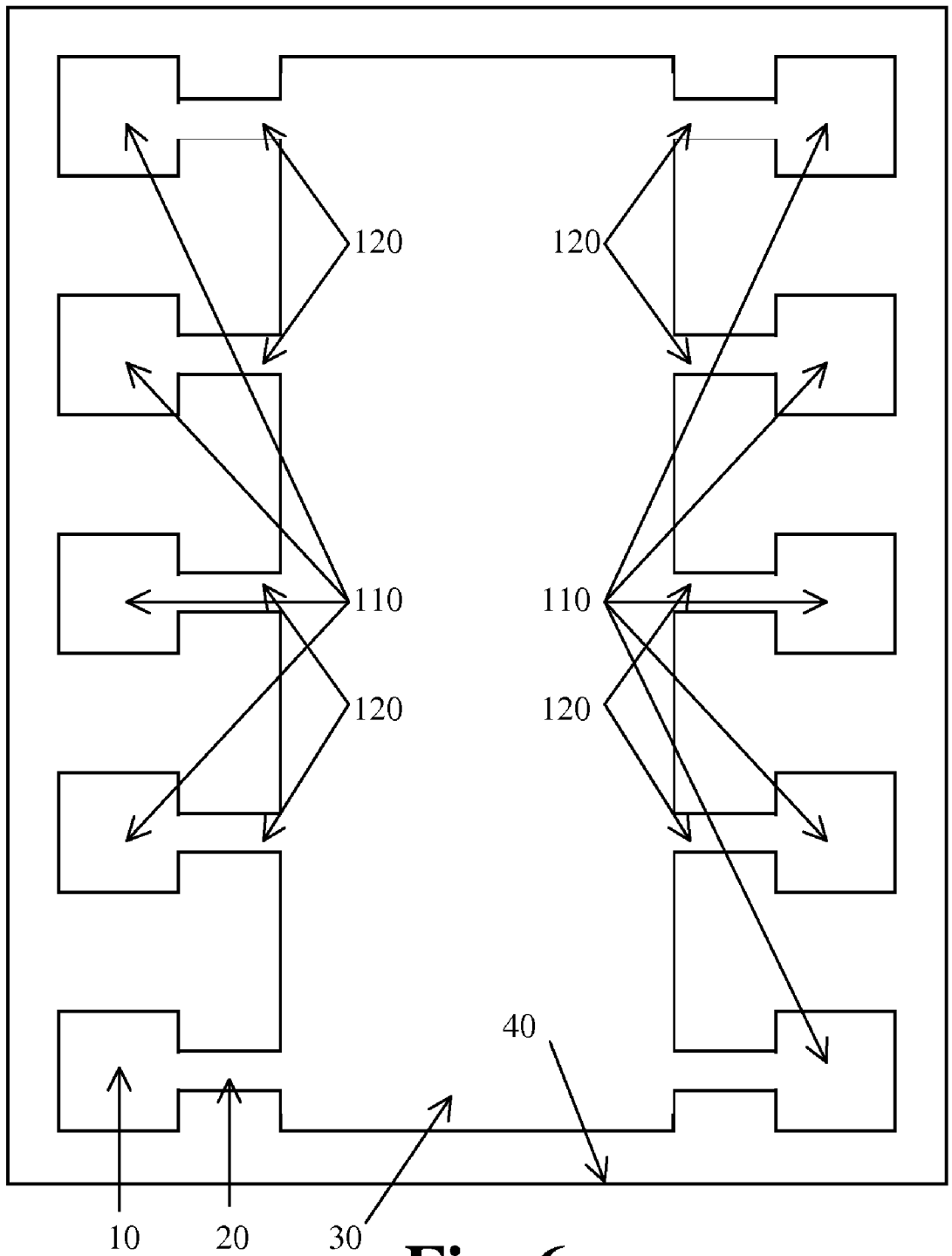
FIG. 6 illustrates a very advantageous embodiment of the method according to the invention.

Referring to FIG. 6, this Figure illustrates a very advantageous embodiment of the method according to the invention. In this embodiment the masking layer 40 is patterned such that there are further openings 110 connected to the second opening 30 with further channels 120. In this embodiment multiple openings 10, 110 benefit from the same etching-species reservoir during the formation of the trenches during the anisotropic etching step. In this particular example the second opening is rectangular, but in practice it may have any shape.

FIGS. 7-12 show different stages of a method of manufacturing a via in a substrate in accordance with the invention. The method illustrated in these Figures comprises all steps of manufacturing openings according to the invention, because before a via can be manufactured the manufacturing of an opening is required. For the sake of properly explaining the method, each of the FIGS. 7-12 comprises a 3-dimensional drawing and three cross-sectional drawings in accordance with the bottom drawing presented in each Figure.

Figure 7:
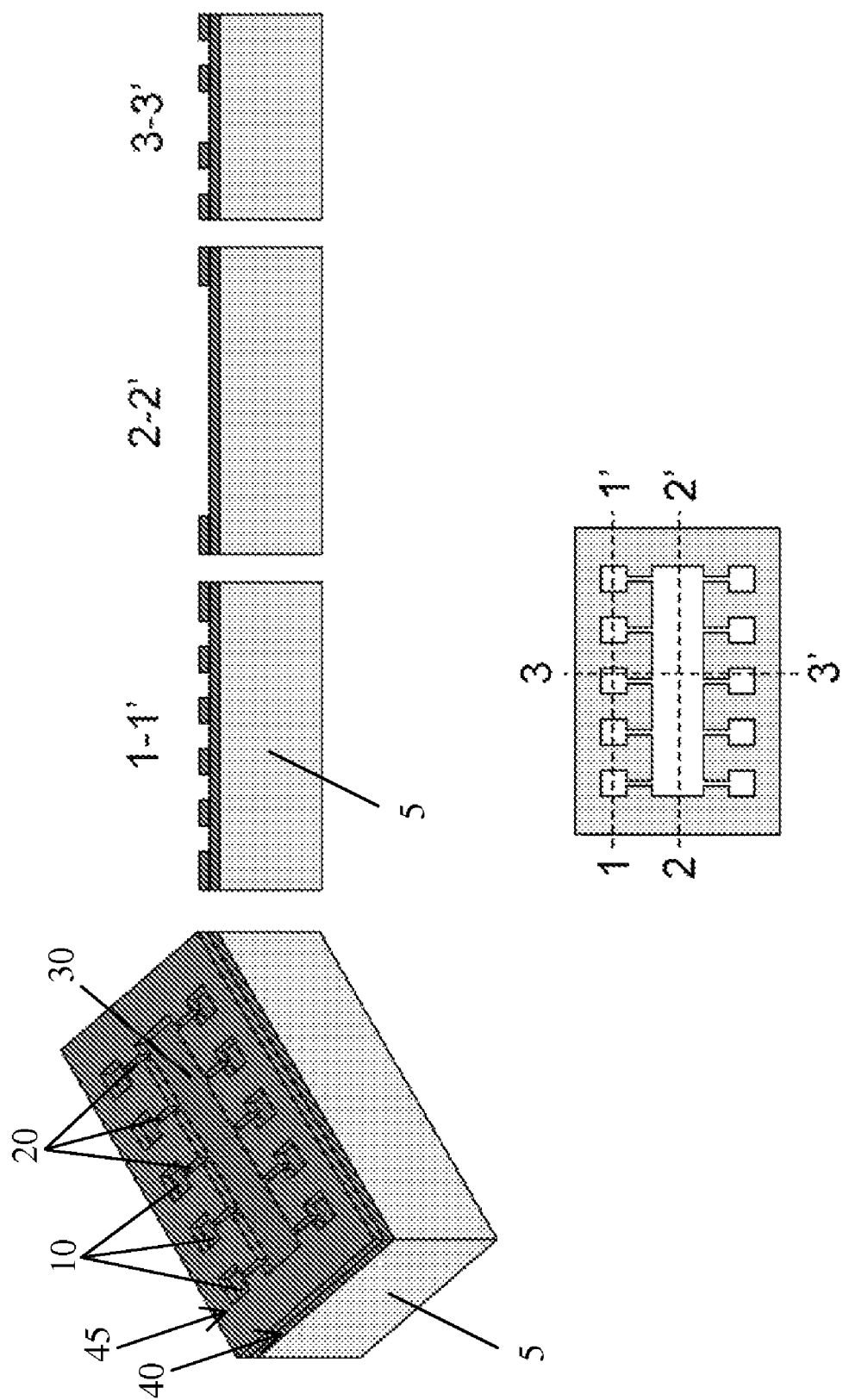
FIGS. 7-12 show different stages of a method of manufacturing a via in a substrate in accordance with the invention.

Referring to FIG. 7, in this stage of the method a substrate 5 is provided with a masking layer 40 on a surface thereof. In this particular example the masking layer 40 is a hard mask and the masking layer 40 is provided with a photoresist layer 45 on top. The hardmask may comprise materials like silicon nitride (Si3N4), silicon carbide (SiC), silicon oxide (SiO$_2$), or any other material that has an etch rate (under the same conditions) that is lower than that of silicon. In this example, the photoresist layer 45 is first provided with a pattern comprising first openings 10 connected to a second (central) opening 30 via a set of channels 20. The number of first openings 10 (also being referred to as "further openings" elsewhere in this specification) in the set depends on the wishes of the designer; it could be any number (including a single opening 10). What is important is that the second opening 30 has a larger area than each of the first openings 10 separately so that it acts as an etching-species reservoir in the step of anisotropic dry etching.

In the present invention, the substrate 5 may include any underlying material or materials that may be used, or upon which a device, a circuit or an epitaxial layer may be formed. In other alternative embodiments, this substrate 5 may include a semiconductor substrate such as e.g. a doped silicon, a gallium arsenide (GaAs), a gallium arsenide phosphide (GaAsP), an indium phosphide (InP), a germanium (Ge), or a silicon germanium SiGe) substrate. The substrate 5 may include for example, an insulating layer such as a SiO$_2$ or a Si3N4 layer in addition to a semiconductor substrate portion. Thus, the term substrate also includes glass, plastic, ceramic, silicon-on-glass, and silicon-on sapphire substrates. The term substrate is thus used to define generally the elements for layers that underlie a layer or portions of interest. Also, the substrate 5 may be any other base on which a layer is formed, for example a glass or metal layer. Hence, the substrate 5 can be any material, which is suitable for making deep openings including an oxide layer such as silicon dioxide or TEOS for example. It can be formed on top of other underlying layers, including substrates and semiconductor or conductive layers.

Figure 8:
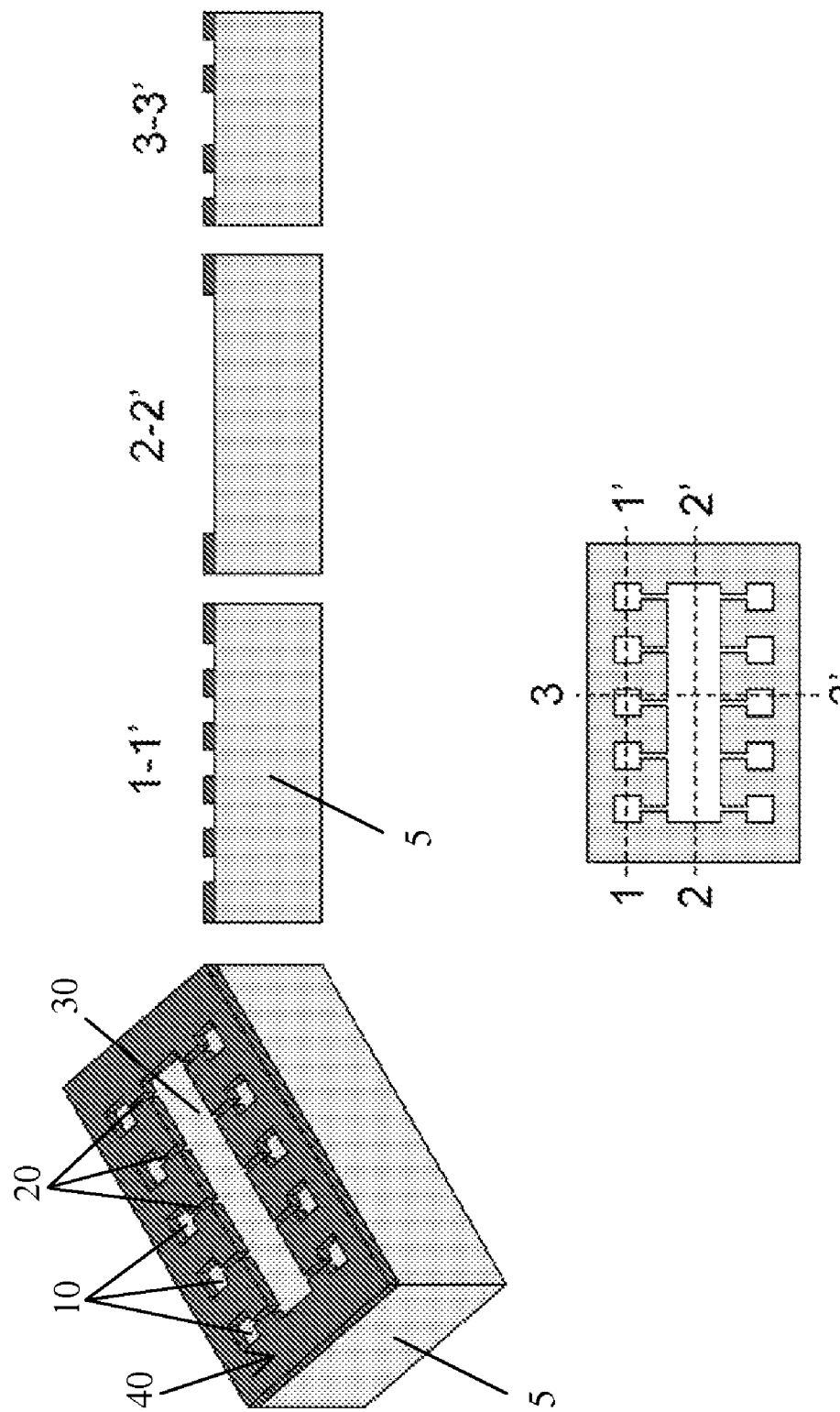

Referring to FIG. 8, in this stage of the method the pattern of the photoresist layer 45 is transferred to the hard mask layer 40 using lithography known the person skilled in the art.

Referring to FIGS. 7 and 8, it must be noted that the function of the hardmask 40 can be taken over by the photoresist layer 45. In that case the photoresist layer 45 is thus the masking layer 40 used for the anisotropic etching in later process steps.

However in order to have well defined small structures, it is better to use a hard mask. Furthermore, photoresist may interfere with the etching process, which makes profile control somewhat more difficult, because photoresist is a source of polymer. Anisotropic dry etching is a technique, which is well known to a person skilled in the art.

Figure 9:
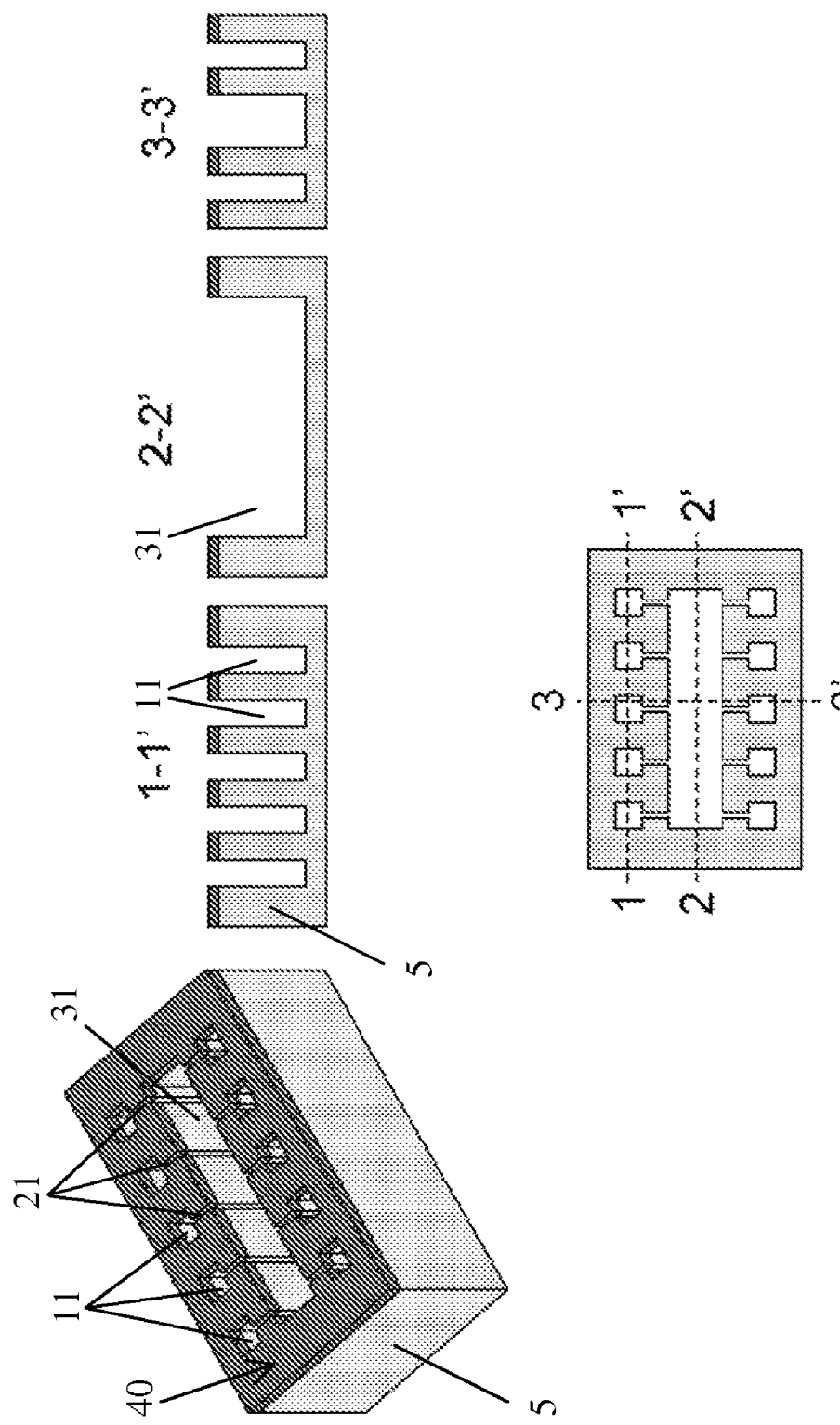

Referring to FIG. 9, in this stage of the method trenches 11, 21, 31 are formed at the location of the openings 10, 30 and the channels 20 by means of anisotropic dry etching under masking of the masking layer 40.

Figure 10:
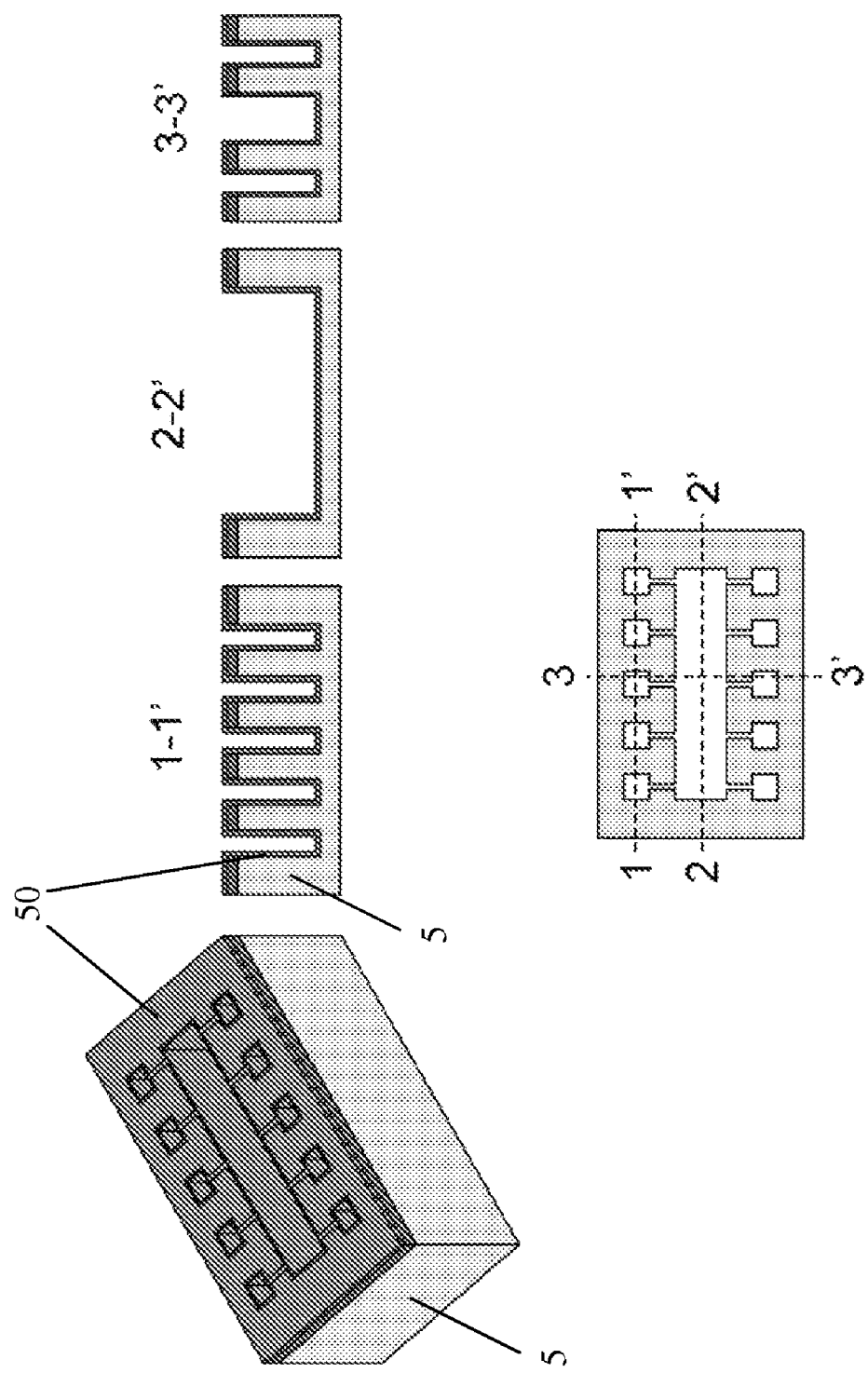

Referring to FIG. 10, in this stage of the method the trenches 21 at the location of the channel 20 are sealed off which is necessary for isolation of the trenches 11 located at the first openings 10 from the trenches 31 located at the second opening 30. In this example the sealing off is done by means of a conformal deposition of a sealing layer 50 on all sidewalls of the trenches 11, 21, 31 located at the first openings 10, the second opening 30 and at the channels 20. This sealing layer 50 may be a dielectric, in which case it also provides electrical insulation of the trenches 11, 31 located at the openings 10, 30. The trenches 21 located at the channel 20 will be sealed of once the thickness of the deposited sealing layer 50 is larger than half of the channel width WC (FIG. 2). Conformal deposition is a technique, which is known to the person skilled in the art. More information on this technique may for instance be found in the following textbook: "*Silicon processing for the VLSI era, process technology*", Volume 1, by S. Wolf and R. N. Tauber, page 185.

Figure 11:
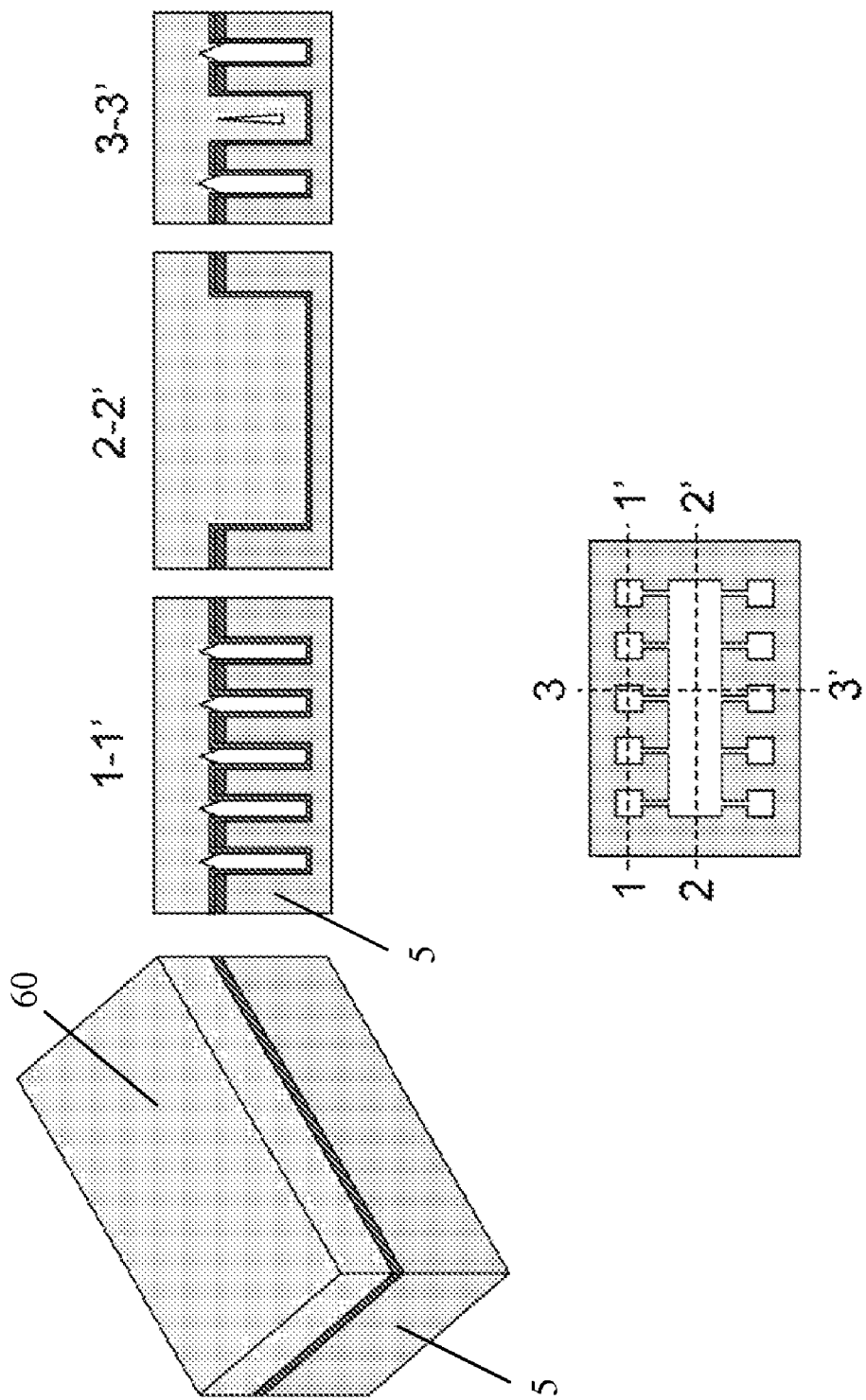

Referring to FIG. 11, in this stage of the method the second opening 30 is sealed off by performing a non-conformal deposition of dielectric material 60 on the substrate 5 such that the trench 31 located at the second opening 30 is filled. The area of the first openings 10 is chosen to be so small that the non-conformal deposition step will close off the first openings 10 at the surface of the substrate 5. On the other hand the area of the second opening 30 is chosen large enough such that the trench 31 located at the second opening 20 will be filled, despite any possible overhang of the dielectric material 60 that results from the non-conformal deposition, which could block the filling the second opening 30 when the area would be small. Non-conformal deposition is a technique, which is known to the person skilled in the art. More information on this technique may for instance be found in the following textbook: "*Silicon processing for the VLSI era, process technology*", Volume 1, by S. Wolf and R. N. Tauber, page 185.

Figure 12:
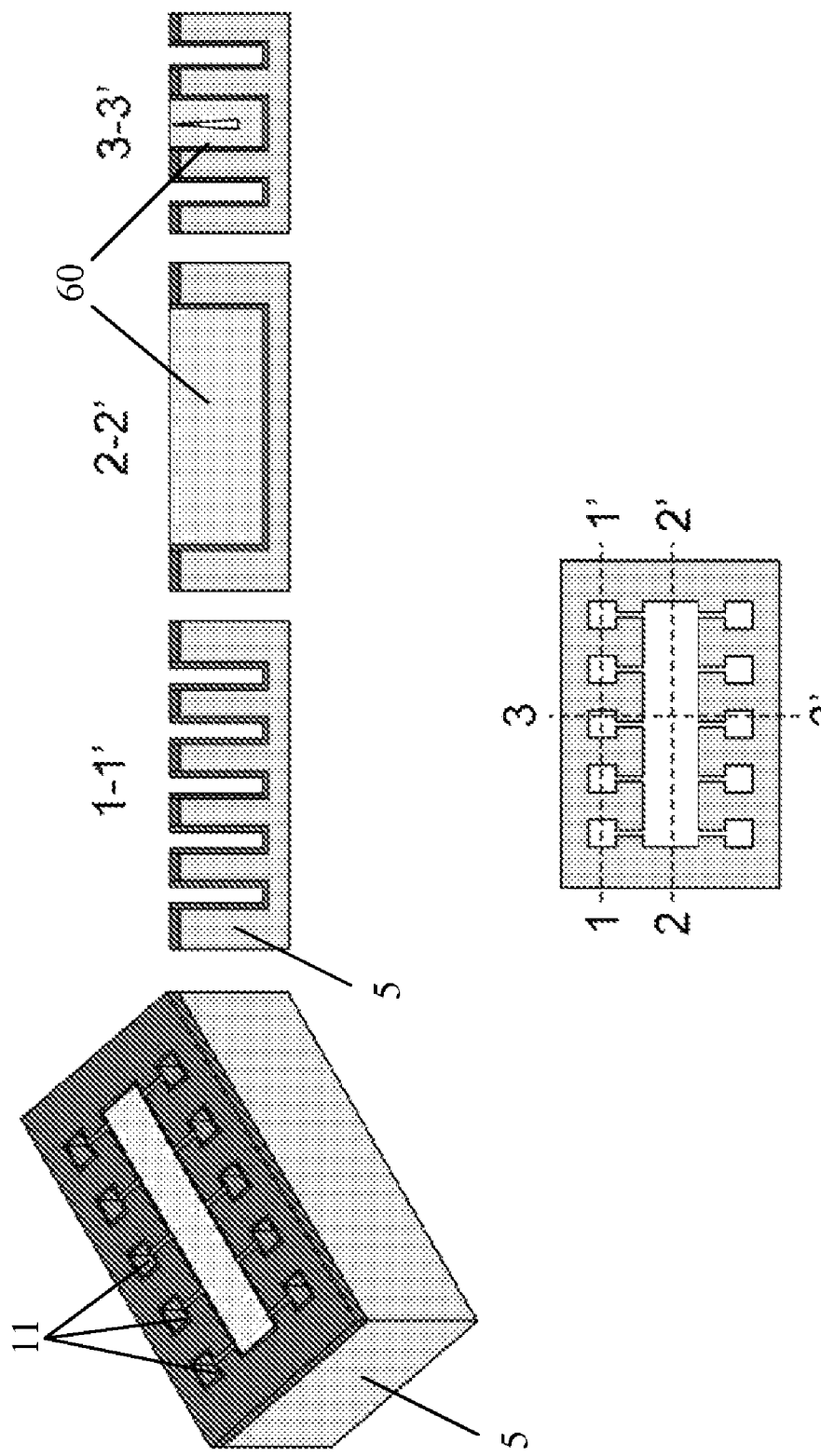

Referring to FIG. 12, in this stage of the method any redundant dielectric material 60 on the substrate 5, which extends above the surface of the substrate 5, is removed by means of chemical-mechanical polishing. This step will then re-open the first openings 10. Preferably, the redundant dielectric material 60 is not removed completely by means of CMP, because debris could fall into the first openings 10. It is preferred that the CMP is stopped before the first openings 10 are re-opened, whereafter a dry etching step may be used to finalize the removal of the redundant material 60, which extends above the surface of the substrate 5.

After the stage mentioned in FIG. 12, the trenches 11 located at the first openings 10 may be filled with conductive material for forming vias (not shown). Examples of possible conductive materials used for these vias are doped polysilicon (Si), Tungsten (W), and copper (Cu). In this patent application the term via is supposed to be interpreted both as "via" as well as "contact".

An alternative approach to the one illustrated in FIGS. 11 and 12 is that instead of filling the trench 31 located at the second opening 30 with dielectric material 60 by using non-conformal dielectric deposition, the trenches 11 located at the first openings 10 and at the trenches 31 located at the second opening 30 are simultaneously filled with a conductive material, for example a metal or a composition of metals, whereafter a metal CMP step is performed. This alternative embodiment of the method saves one process step. In this invention the word "metal" is defined as either one specific metal or a composition of multiple metal layers in which, for example one or few layers may act as adhesion promoter and/or diffusion barrier. An advantageous metal, having superb filling properties is Tungsten W). The benefit of filling both the trenches 11 located at the first openings 10 and the trenches 31 located at the second opening 30 is that there will be a super via (in the trench 31 located at the second opening) next to fine dimensioned vias (in the trenches 11 located at the first openings 10). This super via may serve various different applications.

First of all, the super via may be used as a heat-conducting channel. Second, the super via may be used for carrying large currents, for example as a through-substrate power line. A third application is to use the super via as a low-resistance via for RF applications. In this case it might be attractive in the method of manufacturing the super via to use a two-step barrier deposition; first deposit (as before) a thin barrier layer in the trenches located at the openings 10, 20, 30 (sealing the trench located at the channel 20) and secondly deposit a thicker barrier layer in the trench located at the second opening 30 as to provide a reduced parasitic capacitance for the super via to be formed later in the trench located at the second opening. A further application is to use the super via as an electrical shield for signals going through other vias in the substrate. In case the conductive material is provided such that it fills the trench 31 at the second opening 30 and covers the substrate, the method according to the invention preferably comprises a chemical-mechanical polishing step to remove the redundant conductive material.

After having made vias in the substrate 5 that extend substantially through the substrate 5, the skilled person may apply conventional techniques in order to make a through-substrate via. Such a method may for example look like:
- the provision of a temporary support substrate on the surface of the substrate comprising the via, using an adhesive layer;
- thinning down the substrate from its back-side which exposes the bottom of the via, the thinning down being, for example, a grinding or etching step or an combination of both, and
- providing an interconnection to the via on the backside of the substrate, the step, for example, comprising sub-steps of: deposition of a barrier layer, deposition of a seed layer on the barrier layer, and then performing copper plating on the backside for making electrical connecting to the via.

This method may be performed at the end of further back-end processing, wherein the interconnecting layers (a stack of dielectric layer comprising wires) on the surface of the substrate are made. In that case the temporary support substrate is provided on top of the stack of layers, for example the last step of the method may comprise many more steps in order to manufacture more complex interconnecting structures on the backside of the substrate.

The invention thus provides a method of manufacturing openings in a substrate, the method comprising steps of:
- providing the substrate with a masking layer on a surface thereof;
- forming a first opening, a second opening, and a channel in between the first opening and the second opening in the masking layer, the channel connecting the first opening with the second opening, the second opening having an area that is larger than the area of the first opening;
- forming trenches in the substrate located at the first opening, the second opening, and at the channel under masking of the masking layer by means of anisotropic dry etching, and
- sealing off the trench located at the channel.

The method according to the invention enables the realization of small (width<~1 μm), high density and deep (depth>~50 μm) through-(silicon)-substrate openings using dry etching. The method also enables use of moderate density but very deep (depth of non-thinned wafer may be in the order of 700 μm) trenches and via's enabling peripheral and/or surface backside connections.

The invention also provides a method of manufacturing a via in a substrate, which comprises the steps mentioned above, wherein, after the step of sealing off the trench located at the channel, the trench located at the first opening is filled with a conductive material for forming the via.

By doing so, vias are formed which are suitable for use as through-substrate vias, because of their high aspect ratio, which can be very high. This is especially advantageous in the case of thick substrates, which may be preferred because of handling issues.

The invention also provides a semiconductor device comprising a via in its substrate manufactured by the method according to the invention, the semiconductor device further comprising a circuit integrated therein, the via being a through-substrate via. The semiconductor device obtained by the method according to the invention is very suitable for use in 3-dimensional integrated circuits having thick substrates, because the invention enables the manufacturing of high-aspect ratio through-substrate vias, which can be used as vertical interconnections.

The semiconductor device obtained by the invention is also very suitable for use in a semiconductor device, which needs to be contacted from its backside (this might be required because of the package chosen for the integrated circuit.

The invention also relates to a 3-dimensional integrated circuit comprising a stack of semiconductor devices, wherein the circuits on the semiconductor devices are interconnected by at least one through-substrate via. Such a 3-dimensional integrated circuit benefits greatly from the method according to the invention, because the invention has enabled high-density high aspect-ratio vertical interconnections between the stacked semiconductor devices.

The present invention has been described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The invention claimed is:

1. Method of manufacturing openings in a substrate, the method comprising steps of:
   providing the substrate with a masking layer on a surface thereof;
   forming a first opening, a second opening, and a channel in between the first opening and the second opening in the masking layer, the channel connecting the first opening with the second opening, the second opening having an area that is larger than the area of the first opening;
   forming trenches in the substrate located at the first opening, the second opening, and at the channel under masking of the masking layer by means of anisotropic dry etching, and
   sealing off the trench located at the channel for forming the openings in the substrate.

2. A method as claimed in claim 1, wherein the channel is formed with a minimum channel width chosen smaller than a minimum width of the first opening, the minimum channel width being defined as the minimum dimension measured parallel to the surface and perpendicular to the channel, the minimum width of the first opening being defined as the minimum dimension of the first opening measured in any direction parallel to the surface.

3. Method as claimed in claim 2, wherein the sealing off of the trench located at the channel is done by depositing a sealing layer in a conformal way on the substrate and on all sidewalls of the trenches.

4. Method as claimed in claim 3, wherein the sealing layer is a dielectric.

5. Method as claimed in claim 1, wherein an aspect ratio of the trench formed at the first opening is larger than 50.

6. Method as claimed in claim 1, wherein, in the step of forming openings in the masking layer, a further opening and a further channel in between the further opening and the second opening are formed in the masking layer, the further channel connecting the further opening with the second opening, the second opening having a larger area than the further opening.

7. Method as claimed in claim 6, wherein, in the step of forming trenches in the substrate, further trenches are formed at the further opening and at the further channel.

8. Method of manufacturing a via in a substrate comprising the method as claimed in claim 1, wherein, after the step of sealing off the trench located at the channel, the trench located at the first opening is filled with a conductive material for forming the via.

9. Method as claimed in claim 8, wherein the conductive material used for filling the trench located at the first opening comprises a metal.

10. Method as claimed in claim 9, wherein the metal comprises Tungsten.

11. Method as claimed in claim 8, wherein the trench located at the second opening is sealed off after formation of the trenches.

12. Method as claimed in claim 11, wherein the step of sealing off the trench located at the second opening comprises filling the trench located at the second opening.

13. Method as claimed in claim 12, wherein the filling of the trench located at the second opening is done by means of deposition of dielectric material in a non-conformal way on the substrate such that the dielectric material fills the trench located at the second opening and covers the substrate.

14. Method as claimed in claim 12, wherein the filling of the trench located at the second opening is done with a conductive material.

15. Method as claimed in claim 14, wherein the filling of the trench located at the second opening is done simultaneously with the filling of the trench located at the first opening.

* * * * *